US008748082B2

(12) United States Patent
Kanga

(10) Patent No.: US 8,748,082 B2
(45) Date of Patent: Jun. 10, 2014

(54) LASER ENGRAVABLE FLEXOGRAPHIC PRINTING ARTICLES BASED ON MILLABLE POLYURETHANES, AND METHOD

(71) Applicant: Rustom S. Kanga, Marietta, GA (US)

(72) Inventor: Rustom S. Kanga, Marietta, GA (US)

(73) Assignee: Xiper Innovations, Inc., Marietta, GA (US)

( * ) Notice: Subject to any disclaimer, the term of this patent is extended or adjusted under 35 U.S.C. 154(b) by 0 days.

(21) Appl. No.: 13/926,585

(22) Filed: Jun. 25, 2013

(65) Prior Publication Data

US 2013/0285291 A1 Oct. 31, 2013

Related U.S. Application Data

(60) Division of application No. 12/356,330, filed on Jan. 20, 2009, now Pat. No. 8,501,390, and a continuation-in-part of application No. 11/813,612, filed as application No. PCT/US2007/072246 on Jun. 27, 2007, now abandoned.

(60) Provisional application No. 61/083,327, filed on Jul. 24, 2008, provisional application No. 60/816,786, filed on Jun. 27, 2006.

(51) Int. Cl.
*G03F 7/00* (2006.01)
*G03F 7/26* (2006.01)
*B41G 7/00* (2006.01)

(52) U.S. Cl.
USPC .................... 430/306; 430/270.1; 430/284.1; 101/368

(58) Field of Classification Search
USPC ........................................................ 430/306
See application file for complete search history.

(56) References Cited

U.S. PATENT DOCUMENTS 3,549,733 A 12/1970 Caddell
3,658,531 A * 4/1972 Kurtz .............................. 430/18
3,954,681 A * 5/1976 Castle .............................. 521/49
4,762,884 A 8/1988 Goyert et al.
5,259,311 A 11/1993 McCaughey, Jr.
5,798,202 A 8/1998 Cushner et al.
5,804,353 A 9/1998 Cushner et al.
5,925,500 A 7/1999 Yang et al.
6,209,646 B1 4/2001 Reddy et al.
6,258,310 B1 7/2001 Sardanopoli et al.
6,511,784 B1 1/2003 Hiller et al.

(Continued)

OTHER PUBLICATIONS

Hofmann, Uwe; High Performance Millable Urethanes; Rubber World; Nov. 1, 2002; 0035-9572; Lippincott & Peto, Inc., 1USA.

(Continued)

*Primary Examiner* — Chanceity Robinson
(74) *Attorney, Agent, or Firm* — Shumaker, Loop & Kendrick, LLP

(57) ABSTRACT

A flexographic printing sleeve or plate is made by a method that includes providing a millable polyurethane, crosslinking the millable polyurethane, and forming a relief by at least laser engraving the crosslinked millable polyurethane. For example, crosslinking may be accomplished by a peroxide-based process or by a vulcanization process using sulfur. A relief in one example is formed by extruding the millable polyurethane, thermally crosslinking the polyurethane after the extrusion step and laser engraving the crosslinked millable polyurethane. A printing article is formed into the shape of a flat printing plate or a continuous in-the-round printing sleeve.

8 Claims, 17 Drawing Sheets

Table 1: Type of Commercially Available MPU and MPU Blends Tested

| Type of Polymer | Hard Segment Isocyanate | Soft Segment Urethane Type | Curative |
|---|---|---|---|
| Millable Polyurethane | MDI | Polyester | P |
| Millable Polyurethane | Aliphatic | Polyester | P |
| Millable Polyurethane | MDI | Polyether | P |
| Millable Polyurethane | MDI | Polyether | S |
| Millable Polyurethane | TDI | Polyester | P |
| Millable Polyurethane | TDI | Polyester | S |
| Millable Polyurethane | TDI | Polyether | P |
| Millable Polyurethane | TDI | Polyether | S |
| Millable Polyurethane/ NBR Blend | MDI | Polyester | P |
| Millable Polyurethane/ NBR Blend | TDI | Polyester | P |
| Millable Polyurethane/ NBR Blend | TDI | Polyester | S |

(56) References Cited

U.S. PATENT DOCUMENTS

| | | | |
|---|---|---|---|
| 6,551,762 B1 | 4/2003 | Gaignou et al. | |
| 6,596,818 B1 | 7/2003 | Zamore | |
| 6,627,385 B2 | 9/2003 | Hiller et al. | |
| 6,655,281 B1 | 12/2003 | Jordan et al. | |
| 6,737,216 B2 | 5/2004 | Kannurpatti et al. | |
| 6,773,859 B2 | 8/2004 | Fan et al. | |
| 6,880,461 B2 | 4/2005 | Hiller | |
| 6,913,869 B2 | 7/2005 | Leinenbach et al. | |
| 6,921,625 B2 * | 7/2005 | Kaczun et al. | 430/306 |
| 6,935,236 B2 | 8/2005 | Hiller et al. | |
| 7,029,825 B2 | 4/2006 | Yokota et al. | |
| 7,101,653 B2 | 9/2006 | Kaczun et al. | |
| 2002/0169255 A1 | 11/2002 | Lagneaux et al. | |
| 2004/0241583 A1 * | 12/2004 | Kanga | 430/300 |
| 2006/0106158 A1 | 5/2006 | Dewanjee et al. | |

OTHER PUBLICATIONS

Ahnemiller, Jim; An Introduction to the Chemistry of Polyurethane Rubbers; Rubber World; Nov. 1, 1999; 0035-9572; Lippincott & Peto, Inc., 1USA.

Jablonowski, Thomas L.; Peroxide Curing of Millable Polyurethane; Rubber World; Nov. 1, 1999; 0035-9572; Lippincott & Peto, Inc., 1USA.

Reichel, Curt; New Advances In Millable Urethanes; Rubber World; Feb. 1, 2006; 0035-9572; Lippincott & Peto, Inc.

* cited by examiner

Table 1: Type of Commercially Available MPU and MPU Blends Tested

| Type of Polymer | Hard Segment Isocyanate | Soft Segment Urethane Type | Curative |
|---|---|---|---|
| Millable Polyurethane | MDI | Polyester | P |
| Millable Polyurethane | Aliphatic | Polyester | P |
| Millable Polyurethane | MDI | Polyether | P |
| Millable Polyurethane | MDI | Polyether | S |
| Millable Polyurethane | TDI | Polyester | P |
| Millable Polyurethane | TDI | Polyester | S |
| Millable Polyurethane | TDI | Polyether | P |
| Millable Polyurethane | TDI | Polyether | S |
| Millable Polyurethane/ NBR Blend | MDI | Polyester | P |
| Millable Polyurethane/ NBR Blend | TDI | Polyester | P |
| Millable Polyurethane/ NBR Blend | TDI | Polyester | S |

FIG. 1

Table 2: Typical Flexographic Printing Plate Physicals

| | |
|---|---|
| Elongation, % | 200-1000 |
| | |
| Tensile (Break), PSI | 500-5000 |
| | |
| Modulus, PSI | 250-2500 |
| | |
| Shore A° | 50-70 |
| | |
| Resilience, % | 45-60 |
| | |
| Swells, Wt% (After Cure) | |
| | |
| Water | <1 |
| n-Propyl Alcohol | <5 |
| NPA/NPAcetate | <10 |
| UV Ink | <5 |

FIG. 2

Table 3: Sample Set for the Engraving Test on Yttrium-based Fiber Laser (1100 NM)

| | MPU | Urethane Type | Isocyanate | Black | Cure Type | Postcure |
|---|---|---|---|---|---|---|
| A | Millathane 50004 | Polyester | MDI | Yes | Peroxide-DBPH | Yes |
| B | Millathane HT | Polyester | aliphatic | Yes | Sulfur | Yes |
| C | Millathane 66 | Polyester | MDI | Yes | Peroxide-DBPH | Yes |
| D | Millathane 66 | Polyester | MDI | Yes | Peroxide-DBPH | Yes |
| E | Millathane 26 | Polyether | MDI | Yes | Peroxide-DBPH | Yes |
| F | Millathane E34 | Polyether | TDI | Yes | Peroxide-DBPH | Yes |
| G | Millathane E34 | Polyether | TDI | Yes | Sulfur | Yes |

FIG. 3

Table 4: Process Conditions and Physical Properties of Sample Set from Table III

| Formulation from Table III: | A | B | C | D | E | F | G |
|---|---|---|---|---|---|---|---|
| **Mooney Viscosity** | | | | | | | |
| ML(1+4)/100°C | 59 | 36 | 41 | 31 | 80 | 52 | 50 |
| **Press Cure, minutes at 160°C --->** | 19 | 12 | 19 | 18 | 2 | 14 | 7 |
| **Physical Property after Cure** | | | | | | | |
| Hardness, Shore A | 73 | 65 | 68 | 65 | 65 | 65 | 65 |
| TSE-100*, psi | 870 | 380 | 460 | 415 | 275 | 590 | 405 |
| TSE-200, psi | 2300 | 860 | 1210 | 1090 | 615 | 1720 | 935 |
| TSE-300, psi | | 1490 | 2370 | 2110 | 1010 | | 1650 |
| Tensile Strength, psi | 3510 | 4170 | 4170 | 3700 | 2170 | 2370 | 3600 |
| Elongation, % | 280 | 575 | 445 | 445 | 650 | 255 | 490 |
| Tear, Die C, lb/in | 171 | 201 | 206 | 185 | 214 | 71 | 210 |
| Tear, Die B, lb/in | 347 | 365 | 368 | 335 | 394 | 151 | 332 |
| **Postcure 2 hr/100°C** | | | | | | | |
| **Physical Property after Cure and Postcure** | | | | | | | |
| Hardness, Shore A | 73 | 72 | 70 | 65 | 65 | 66 | 67 |
| TSE-100*, psi | 880 | 470 | 500 | 415 | 246 | 695 | 500 |
| TSE-200, psi | 2320 | 1090 | 1280 | 1030 | 560 | 2010 | 1170 |
| TSE-300, psi | | 1850 | 2460 | 2050 | 970 | | 1980 |
| Tensile Strength, psi | 3500 | 3900 | 4160 | 4170 | 2120 | 2100 | 3360 |
| Elongation, % | 285 | 490 | 430 | 475 | 680 | 205 | 430 |
| Tear, Die C, lb/in | 178 | 214 | 217 | 208 | 213 | 81 | 208 |
| Tear, Die B, lb/in | 340 | 383 | 395 | 359 | 377 | 125 | 297 |
| **Bashore Resilience** | | | | | | | |
| % | 43 | 20 | 48 | 51 | 46 | 51 | 52 |
| **Compression Set, %** | | | | | | | |
| 22 hr/70°C | 10 | 55 | 8 | 7 | 22 | 13 | 30 |

FIG. 4

Table 5: Engraving Test on Yttrium-based Fiber Laser (1100 NM)

| Formulated sample from Table III | Relief depth at 100% laser power [µm] | Laser power for test motif [%] | Test motif relief depth [µm] | Undercut 1% [µm] | Undercut 2% [µm] | Visual assessment |
|---|---|---|---|---|---|---|
| A | 420 | 105 | 460 | 17 | 4 | Good depiction even with very fine elements, faint lines in shoulder area |
| B | 490 | 90 | 460 | 80 | 0 | Good depiction even with very fine elements, processed surfaces smooth and glossy |
| C | 430 | 110 | 500 | 37 | 0 | Good depiction even with very fine elements |
| D | 460 | 100 | 460 | 28 | 5 | Good depiction even with very fine elements, faint lines in shoulder area |
| E | 310 | 120 | 420 | 30 | 10 | Very rough substrate (small amount of lamella formation), faulty element depiction |
| F | 460 | 100 | 490 | 15 | 5 | Good depiction even with very fine elements, lines in shoulder area |
| G | 490 | 85 | 450 | 18 | 8 | Good depiction of fine elements, very fine lines in shoulder area |

FIG. 5

Table 6: Test Results of the MPU and MPU/Rubber Blends Sample Set used for the Engraving Test on the $CO_2$ Laser (10,600 NM)

| | Formula | Type of Polyurethane and/or Blend | Engraving Test Results |
|---|---|---|---|
| 1 | XP-5188-A | MDI-ester. Peroxide cured. Black. TMPTMA Coagent | Clean Ablation @ 100%/10 mps. Better response @ 50%/5MPS. Needed only a Detergent/water spray for cleanout of debris for ALL samples |
| 2 | XP-5188-B | MDI-ester/Paracril NBR Rubber (75:25) Blend. Peroxide cured. Black | Same as Sample 1 above. Slightly sharper image? |
| 3 | XP-5178-A | MDI-ester. Peroxide cured. Non-Black. Different Coagent | Clear Compound (NOT Black) ablates cleanly as before. However, image is not as sharp. Indicates the neccessity of use of CB Pigment for good ablation! |
| 4 | XP-5172-A | MDI-ester. Peroxide cured. Non-Black. | Different PU compound from 1. Compare with 5 which has higher coagent |
| 5 | XP-5172-C | MDI-ester. Peroxide cured. Black. TMPTMA Coagent | Same compound as 4. Higher co-agent. Much sharper image. Compared to 1&2 higher response due to higher CB! |
| 6 | XP-5140-MBA | MDI-ether. Peroxide cured. Non-Black. | MDI-ether not as sharp as MDI-ester. However Ethers may have certain advantages |
| 7 | XP-5140-M | MDI-ether. Peroxide cured. Non-Black. TMPTMA Coagent | Sharper than 6 above due to higher coagent! May need further optimization for it to function properly. |
| 8 | XP-5142-DX | TDI-Ester/NBR Blend. Sulfur cured. Black. TMPTMA Coagent | TDI-ester gave best imageable compound from all tested. Need to understand Pros-Cons of TDI Vs MDI |
| 9 | XP-5142- FX | TDI-Ester. Sulfur cured. Black. TMPTMA Coagent | Need better understanding of Sulfur Cured Vs Peroxide Cured Compare Sample 9 (Pure PU) Vs 8 (PU/Rubber Blend) |
| 10 | XP-5142- C | TDI-Ester/NBR Blend. Peroxide cured. Black. TMPTMA Coagent | Not done here! Compare Peroxide cure vs Sulfur cure |

FIG. 6

Table 7: Physical Properies and Test Results of Cast Polyurethanes used for the Engraving Test on the $CO_2$ Laser (10,600 NM)

Physical Property of CPU after Cure

| | |
|---|---|
| Hardness, Shore A | 66 |
| Tensile Strength, psi | 6320 |
| 100% Modulus, psi | 387 |
| 300% Modulus, psi | 730 |
| Elongation, % | 280 |
| Tear, Die C (D624), PLI | 319 |
| Tear, Split (D1938), PLI, Avg | 77 |
| Bashore Resilience | 31 |

| | Formula | Type of Cast Polyurethane | Engraving Test Results |
|---|---|---|---|
| 1 | 11407-20 | MDI-ester. Cast PU. Shore A 70, Black. | Severe Melting artifacts. Cannot image. |
| 2 | 11207-20 | MDI-ester. Cast PU. Shore A 70, Clear | Similar to above showed severe melting artifacts. Compare Sample 12 (w/o CB) to 11 (W/ CB) |
| 3 | 11407-21 | MDI-ester. Cast PU. Shore A 60, Black. | Skipped this due to unsatisfactory results from 11 and 12 |
| 4 | 11207-21 | MDI-ester. Cast PU. Shore A 60, Clear | Skipped this due to unsatisfactory results from 11 and 12 |

FIG. 7

Table 8: Thermal Crosslinking of TPUs during extrusion

| | | 8-A | 8-B | 8-C | 8-D | 8-E | 8-F | 8-G | 8-H |
|---|---|---|---|---|---|---|---|---|---|
| Raw Materials | Manufacturer | PHR | PHR | PHR | PHR | PHR | PHR | PHR | PHR |
| Irogran A 60E 4902DP | Huntsman | 100 | 100 | 100 | 100 | | | | |
| Desmopan 6065A | Bayer | | | | | 100 | 100 | 100 | 100 |
| Joncryl ADD-2300 | Johnson Polymer | 1 | | 1 | | 1 | | 1 | |
| Joncryl ADR-4380 | Johnson Polymer | | 1 | | 1 | | 1 | | 1 |
| Alsibronze Mica | Engelhard | 1 | | 1 | | 1 | | 1 | |
| Kaolin Clay ASP 170 | Engelhard | | 1 | | 1 | | 1 | | 1 |
| Mark-It | Engelhard | | | | | | | | 1 |
| Santicizer 160 | Ferro | | | 5 | 5 | | | 5 | 5 |
| NanoArc CuO | Nanophase Technologies | | | 1 | 1 | | | 1 | 1 |
| Total | | 102 | 102 | 108 | 108 | 102 | 102 | 108 | 109 |

FIG. 8

Table 9 : Formulation for Crosslinking of Typical MPU using both Peroxide and Sulfur Cure Systems

| | Sample A Table 3 Peroxide Cure | Sample B Table 3 Sulfur Cure |
|---|---|---|
| | PHR | PHR |
| Millathane® 5004 | 100 | |
| Millathane HT | | 100 |
| Stearic acid | 0.2 | |
| Zinc stearate | | 0.5 |
| N330 | 12.5 | 12.5 |
| N330 Black | 25 | 25 |
| TP-95 | 2 | 2 |
| Struktol WB222 | 0.5 | 0.5 |
| Stabaxol P | 1.5 | 1.5 |
| SR 350 | 5 | |
| N330 | 12.5 | 12.5 |
| **Add on mill after the above is mixed** | | |
| Varox DBPH-50 | 5 | |
| MBTS | | 4 |
| MBT | | 2 |
| Thanecure ZM | | 1 |
| Sulfur | | 1.5 |
| Total | 139.2 | 138 |

FIG. 9

Select Digital Images from Engraving Test on Yttrium-based Fiber Laser (1100 NM). Samples as listed in Table 3

*Sample A*

*Sample C*

*Sample G*

LASER ENGRAVABLE FLEXOGRAPHIC PRINTING ARTICLES BASED ON MILLABLE POLYURETHANES, AND METHOD

CROSS-REFERENCE TO RELATED APPLICATION

This application claims the benefit of priority and is a Divisional of U.S. application Ser. No. 12/356,330 filed Jan. 20, 2009, which claims priority to U.S. Application No. 61/083,327 filed Jul. 24, 2008 and is a Continuation-in-Part of U.S. application Ser. No. 11/813,612 filed Jul. 10, 2007, which is a U.S. national stage application of PCT/US2007/072246 filed Jun. 27, 2007, which claims priority to U.S. Application No. 60/816,786 filed Jul. 27, 2006. The contents of all of the above applications are incorporated by reference herein.

TECHNICAL FIELD OF THE INVENTION

The invention relates to an article for use in flexographic printing, such as a plate or sleeve, and a method for laser engraving the printing article to form a relief such that the article can be used in flexographic printing. The present invention also provides a method of crosslinking a Polyurethane Elastomer for making a directly laser engravable flexographic printing article by the use of commercially available Millable Polyurethanes (MPU). The printing article could be either a flat printing plate or a continuous in-the-round printing sleeve. Commercially available MPUs can be compounded either in an extruder or a compounder such as a Brabender using various crosslinking and laser sensitive additives. The compounded MPU is then extruded either on a flat carrier or a round sleeve, crosslinked either during extrusion or thereafter using thermal energy. The extruded and crosslinked MPU is ground or machined to the dimension required for the printing process and is ready for laser engraving. In one embodiment of the invention, the article does not require further processing, and as such can be used in a “direct-to-plate” laser engraving system.

BACKGROUND OF THE INVENTION

Printing plates are well known for use in flexographic printing, particularly on surfaces which are corrugated or smooth, such as packaging materials like cardboard, plastic films, etc. Typically, flexographic printing plates are manufactured using photopolymers which are exposed through a negative, processed using a solvent to remove the non-crosslinked areas to create a relief, which is post-crosslinked and detackified. This is typically a very lengthy and involved process. Recently, flexographic plates have been manufactured using digital imaging of an in situ mask layer which obviates the need for a negative or a photomask to make the plate, and which has other performance benefits as well.

Recently, it has been possible to laser engrave a rubber element directly to provide the desired relief surface necessary for flexographic printing. Laser engraving has provided a wide variety of opportunities for rubber printing plates. Highly concentrated and controllable energy lasers can engrave very fine details in rubber. The relief of the printing plate can be varied in many ways. Very steep as well as gently decreasing relief slopes can be engraved so as to influence the dot gain of such plates. Ethylene propylene diene monomer (EPDM) rubber can be laser engraved to form flexographic printing plates.

The directly engraved type of flexographic printing plate is made from vulcanized rubber. Commercial rubbers can be natural or synthetic, such as EPDM elastomers. Lasers can develop sufficient power densities to ablate certain materials. For example, high-power carbon dioxide ($CO_2$) lasers can ablate many materials such as wood, plastic and rubber and even metals and ceramics. Once the output from a laser is focused at a particular point on a substrate with a suitable power density, it is possible to remove material to a desired depth to create a relief. Areas not struck by the laser beam are not removed. Thus, the use of the laser offers the potential of producing very intricate engravings in a desired material with substantial savings.

U.S. Pat. No. 3,459,733 to Caddell describes a method for producing polymer printing plates. The printing plate is made by exposing a layer of the polymeric material to a controlled laser beam of sufficient intensity to ablate the polymer and form depressions on the surface.

U.S. Pat. Nos. 5,798,202 and 5,804,353 to Cushner et al. disclose processes for making a flexographic printing plate by laser engraving a reinforced elastomeric layer on a flexible support. The process disclosed in U.S. Pat. No. 5,798,202 involves first reinforcing and then laser engraving a single-layer flexographic printing element having a reinforced elastomeric layer on a flexible support. The elastomeric layer may be reinforced mechanically, thermochemically, photochemically or with combinations of these processes. Mechanical reinforcement is provided by incorporating reinforcing agents, such as finely divided particulate material, into the elastomeric layer. Photochemical reinforcement is accomplished by incorporating photohardenable materials into the elastomeric layer and exposing the layer to actinic radiation. Photohardenable materials include photo-crosslinkable and photo-polymerizable systems having a photo-initiator or photo-initiator system.

The process disclosed in U.S. Pat. No. 5,804,353 is similar to U.S. Pat. No. 5,798,202, except that the process involves reinforcing and laser engraving a multilayer flexographic printing element having a reinforced elastomeric top layer, and an intermediate elastomeric layer on a flexible support. The elastomeric layer is reinforced mechanically, thermochemically, photochemically or combinations thereof. Mechanical and photochemical reinforcement is accomplished in the same manner as described by U.S. Pat. No. 5,798,202. The intermediate elastomeric layer may be reinforced as well.

A problem associated with elastomeric elements that are reinforced both mechanically and photochemically is that laser engraving does not efficiently remove the elastomeric material to provide desired relief quality, and ultimately, printing quality. It is desirable to use an additive in the elastomeric layer that is sensitive to infrared light in order to enhance the engraving efficiency of the element. Photochemically reinforcing the element provides the desired properties for engraving as well as in its end-use as a printing plate. However, the presence of the additive as particulate or other absorbing material tends to reduce the penetration of the ultraviolet radiation required to photo-chemically reinforce the element. If the elastomeric layer is insufficiently crosslinked during photochemical reinforcement, the laser radiation cannot effectively remove the material and poor relief quality of the engraved area results. Further, the debris resulting from laser engraving tends to be tacky and difficult to completely remove from the engraved element. Additionally, if the element is not sufficiently photo-chemically reinforced, the required end-use properties as a printing plate are not properly achieved. These problems tend to be exacerbated with increasing concentration of the additive that enhances engraving efficacy.

U.S. Pat. No. 6,627,385 teaches the use of graft copolymers for laser engraving. U.S. Pat. Nos. 6,511,784, 6,737,216 and 6,935,236 teach the use of elastomeric copolymers for laser engraving using various infrared (IR) additives.

Many patents in the field teach the use of typical styrenic thermoplastic elastomers (TPEs) that have been used for photo-crosslinking applications. One problem associated with these non-polar TPEs is that they have limited sensitivity to laser engraving because of their hydrocarbon backbone nature. The use of polar TPEs such as thermoplastic polyurethanes (TPUs) thermoplastic polyester elastomers (TPPE) and thermoplastic polyamide elastomers (TPAE) as both laser engravable systems and as printing elements would be desirable. However, most of the above polar TPEs on the market would not be effective either as laser engravable systems, or as printing plates because they are not crosslinked.

The crosslinking of the above TPEs and especially TPUs has not been done before in flexography, and thus, TPUs have not been used in flexography. However, polyurethanes for flexography have been well known, particularly for liquid photopolymers. By definition, a TPU is solid at room temperature and can be extruded, and is workable at higher temperatures. This characteristic is due to the presence of hard and soft segments that form a network at room temperature, and is thus solid.

This network structure also differentiates TPUs from traditional polyurethanes in its outstanding physical attributes and thus offers an attractive system to be used in flexo applications. However, most elastomers used in Flexo need to be crosslinked to withstand the rigors of the printing process and to minimize swells in the inks used for printing. Additionally, the elastomers used in laser engraving have to be crosslinked. Traditional flexo photopolymers have unsaturation in the backbone, which allows the crosslinking with acrylate monomers and UV photo-initiators. The TPUs on the market today do not have unsaturation. Hence, the difficulty in UV crosslinking these for flexo applications. Additionally, laser engraving of elastomers with lasers lasing in the Near IR wavelengths need to be doped with highly absorptive laser additives. This does not allow UV crosslinking as a viable option to crosslink such elastomers. Thermal crosslinking or vulcanization is the only feasible approach in such applications. Millable Polyurethanes (MPUs) are a special category of TPUs. Millable Polyurethanes, as the name suggests, could be processed in the same way as rubber elastomers, including the use of compounding and extrusion methods. MPUs can be thermally crosslinked in a subsequent crosslink and post-crosslink step.

SUMMARY OF THE INVENTION

Therefore, an object of the present invention is to provide a method for making a laser engravable flexographic printing article.

Another object of the present invention is to provide a reliable method for making a printing plate from crosslinking of Millable Polyurethanes (MPUs).

These and other objects of the present invention can be achieved in the preferred embodiments of the invention described below.

One preferred embodiment of the invention includes a method for making a flexographic printing article including the steps of providing a millable polyurethane, and crosslinking the polyurethane whereby the article can be used in a direct laser engraving flexographic process.

According to another preferred embodiment of the invention, the crosslinked millable polyurethane can be used in the direct laser engraving flexographic process and in flexographic printing without further processing.

According to another preferred embodiment of the invention, the printing article is laser engraved by infrared laser radiation to form a relief such that the article can be used in flexographic printing.

According to another preferred embodiment of the invention, the printing article can be a plate or a sleeve.

According to another preferred embodiment of the invention, the binder is a high performance polyester-based polyurethane processed as a millable polyurethane.

According to another preferred embodiment of the invention, the binder is a high performance polyether-based polyurethane processed as a millable polyurethane.

According to another preferred embodiment of the invention, the millable polyurethane is extruded and thermally crosslinked during extrusion.

According to another preferred embodiment of the invention, the millable polyurethane is compounded in a compounder and thermally crosslinked in a hot press.

According to another preferred embodiment of the invention, the millable polyurethane is milled on a 2-roll mill and thermally crosslinked in a hot press.

According to another preferred embodiment of the invention, at least one crosslinking additive for inducing the thermal crosslinking of the millable polyurethane is provided.

According to another preferred embodiment of the invention, at least one laser additive comprising such as carbon black, kaolin clay, mica, antimony tin oxide, or copper oxide is provided.

According to another preferred embodiment of the invention, the millable polyurethane is thermally crosslinked after extrusion.

According to another preferred embodiment of the invention, the millable polyurethane is crosslinked for about 15-30 minutes at about 240 to 350° F., and the polyurethane is crosslinked during the crosslinking.

According to another preferred embodiment of the invention, the millable polyurethane is post-crosslinked for about 8 to 12 hours at about 180240° F.

According to another preferred embodiment of the invention, the millable polyurethane is crosslinked during crosslinking with electron beam radiation.

According to another preferred embodiment of the invention, the printing article is hot-pressed to a desired dimension.

According to another preferred embodiment of the invention, the printing article is machined to a desired dimension.

According to another preferred embodiment of the invention, the binder is millable polyurethane I rubber blend.

According to another preferred embodiment of the invention, the binder is millable polyurethane/Energetic TPE blend.

According to another preferred embodiment of the invention, at least one additive for dissipating heat such as metal-based nanoparticles and/or metal oxide based nanoparticles or combination of Graphite/Carbon. Black pigment are provided.

According to another preferred embodiment of the invention, at least one burn-rate modifier for increasing the rate of mass transfer during laser engraving such as oxidizers, burn rate catalysts such as Iron Oxides, Copper oxides, Copper Chromates or burn rate accelerators such as nano aluminum, boron and magnesium powders are provided.

According to another preferred embodiment of the invention, microspheres for decreasing the density of the millable polyurethane and increasing the rate of mass transfer during laser engraving of the article are provided.

According to another preferred embodiment of the invention, a method for laser engraving a flexographic printing article includes the steps of providing a millable polyurethane, crosslinking the polyurethane to form a laser engravable article, machined to precise dimension and laser engraving the article to form a relief such that the article can be used in flexographic printing.

According to another preferred embodiment of the invention, the article is engraved with a far infrared radiation laser, such as a carbon dioxide laser (10,600 NM).

According to another preferred embodiment of the invention, the article is engraved with a near infrared radiation laser, such as a Yttrium-based fiber laser (1100 NM), a neodymium doped yttrium aluminum garnet (ND-YAG) laser (1060 NM) and/or a diode array laser (830 NM).

According to another preferred embodiment of the invention, a method for making a flexographic printing article includes the steps of providing a binder such as a thermoplastic elastomer from a millable polyurethane system crosslinking the polyurethane such that the article can be used in a direct laser engraving flexographic process and in flexographic printing without further processing.

In at least one embodiment of the invention, a method of making a flexographic printing article includes providing a millable polyurethane, crosslinking the millable polyurethane to provide a laser-engravable element, and forming a relief in the element by at least laser engraving the crosslinked millable polyurethane. In at least one example, the millable polyurethane is crosslinked by a peroxide-based process. In at least one other example, the millable polyurethane is crosslinked by a vulcanization process using sulfur. The relief may be formed by lasing the element using laser radiation having a wavelength between approximately 830 nanometers and approximately 10,600 nanometers, for example the wavelength may be between approximately 830 nanometers and approximately 1100 nanometers. In at least one example, the article is formed as a flat printing plate, and in another example, the article is formed as a continuous in-the-round printing sleeve.

An additive may be added for increasing laser absorptivity of the element. For example, an additive may be selected from nanomaterials, mica, carbon black, kaolin clay, antimony tin oxide, and copper oxide.

An additive may be added for increasing heat dissipation in the element. For example, an additive may be selected from metal-based nanoparticles, metal-oxide based nanoparticles, carbotherm boron nitride platelets, carbon black, and graphite.

An additive may be added for reducing density of the element. For example, an additive may be selected from microspheres, borosilicate glass bubbles, spherical porous silica, crosslinked microspheres, and unexpanded microspheres containing liquid hydrocarbon.

An additive may be added for decreasing the pyrolysis temperature of the element. For example, an additive may be selected from ammonium perchlorate, ammonium nitrate, potassium nitrate, iron oxide, copper oxide, copper chromate, chrome oxide, manganese oxide, ferrocene, aluminum, boron, magnesium powder, oxetane group energetic thermoplastic elastomers, and azide group energetic thermoplastic elastomers.

In another embodiment of the invention, a flexographic printing article includes a substrate, and an outer layer of a laser-engravable cross-linked millable polyurethane applied to the substrate. The outer layer may be crosslinked, for example, by a peroxide-based process, or by a vulcanization process using sulfur. The outer layer may be absorptive of laser radiation having a wavelength between approximately 830 nanometers and approximately 10,600 nanometers, for example the wavelength may be between approximately 830 nanometers and approximately 1100 nanometers. In at least one example, the article is formed as a flat printing plate, and in another example, the article is formed as a continuous in-the-round printing sleeve.

The outer layer may include an additive for increasing laser absorptivity of the element. For example, an additive may be selected from nanomaterials, mica, carbon black, kaolin clay, antimony tin oxide, and copper oxide.

The outer layer may include an additive for increasing heat dissipation in the element. For example, an additive may be selected from metal-based nanoparticles, metal-oxide based nanoparticles, carbotherm boron nitride platelets, carbon black, and graphite.

The outer layer may include an additive for reducing density of the element. For example, an additive may be selected from microspheres, borosilicate glass bubbles, spherical porous silica, crosslinked microspheres, and unexpanded microspheres containing liquid hydrocarbon.

The outer layer may include an additive for decreasing the pyrolysis temperature of the element. For example, an additive may be selected from ammonium perchlorate, ammonium nitrate, potassium nitrate, iron oxide, copper oxide, copper chromate, chrome oxide, manganese oxide, ferrocene, aluminum, boron, magnesium powder, oxetane group energetic thermoplastic elastomers, and azide group energetic thermoplastic elastomers.

BRIEF DESCRIPTION OF THE DRAWINGS

The subject matter that is regarded as the invention may be best understood by reference to the following description taken in conjunction with the accompanying drawing figures in which:

FIG. 1 provides Table 1, which lists tested MPU and MPU blends;

FIG. 2 provides Table 2, which lists typical flexographic printing plate physicals;

FIG. 3 provides Table 3, which lists samples used in engraving tests with an Yttrium-based laser;

FIG. 4 provides Table 4, which lists process conditions and physical properties of the sample sets of Table 3;

FIG. 5 provides Table 5, which lists results of the Yttrium-based laser engraving test of the sample sets of Table 3;

FIG. 6 provides Table 6, which lists test results of an engraving test on MPU and MPU/Rubber blends using a CO2 laser;

FIG. 7 provides Table 7, which lists physical properties and test results of cast polyurethanes used for an engraving test using a CO2 laser;

FIG. 8 provides Table 8, which lists PHR values for thermal crosslinking of TPUs during extrusion;

FIG. 9 provides Table 9, which lists a formulation for crosslinking an MPU by peroxide and sulfur cure systems;

DETAILED DESCRIPTION OF THE PREFERRED EMBODIMENTS AND BEST MODE

Figure 10:
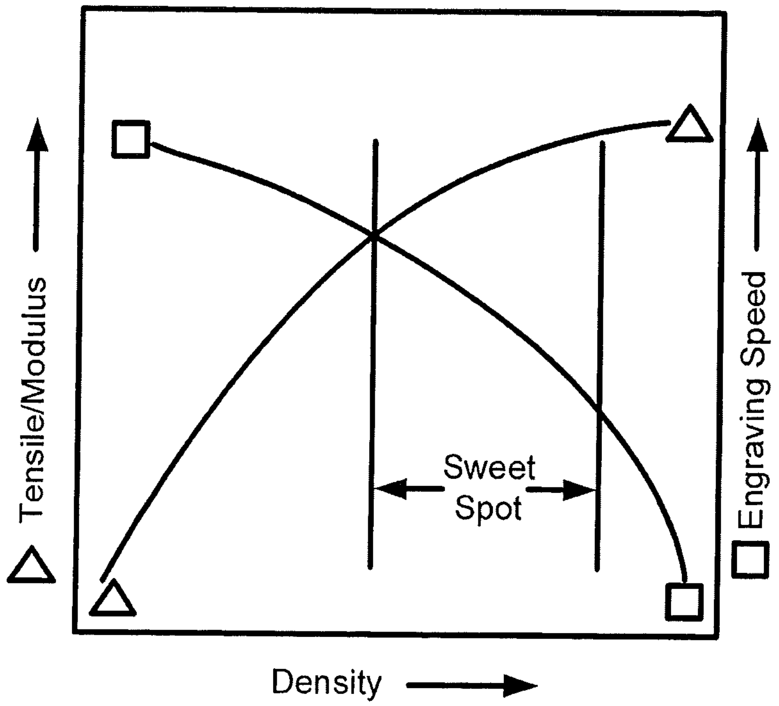
FIG. 10 is a graph for illustrating the theoretical concept of balancing the physical properties and laser sensitivity.
Figure 11A:
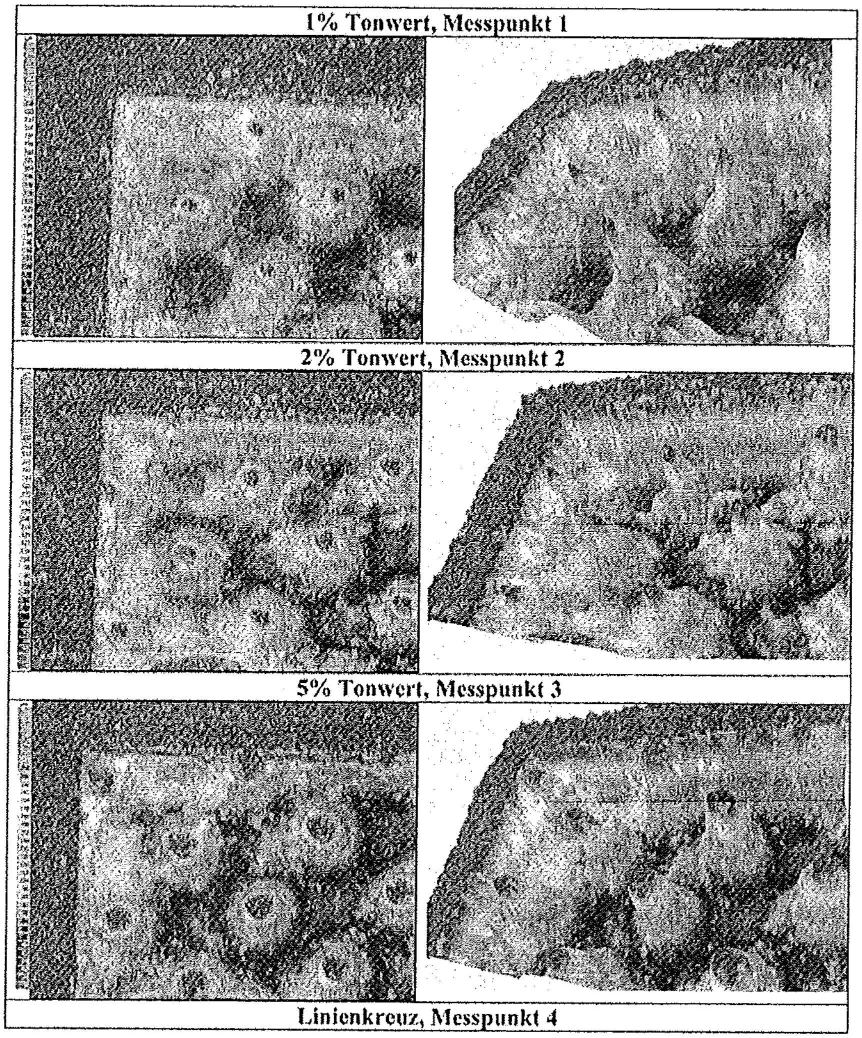
FIGS. 11A-11F provide digital photographic images from an engraving test on MPU and MPU/Rubber blends using an Yttrium-base fiber laser.
Figure 11B:
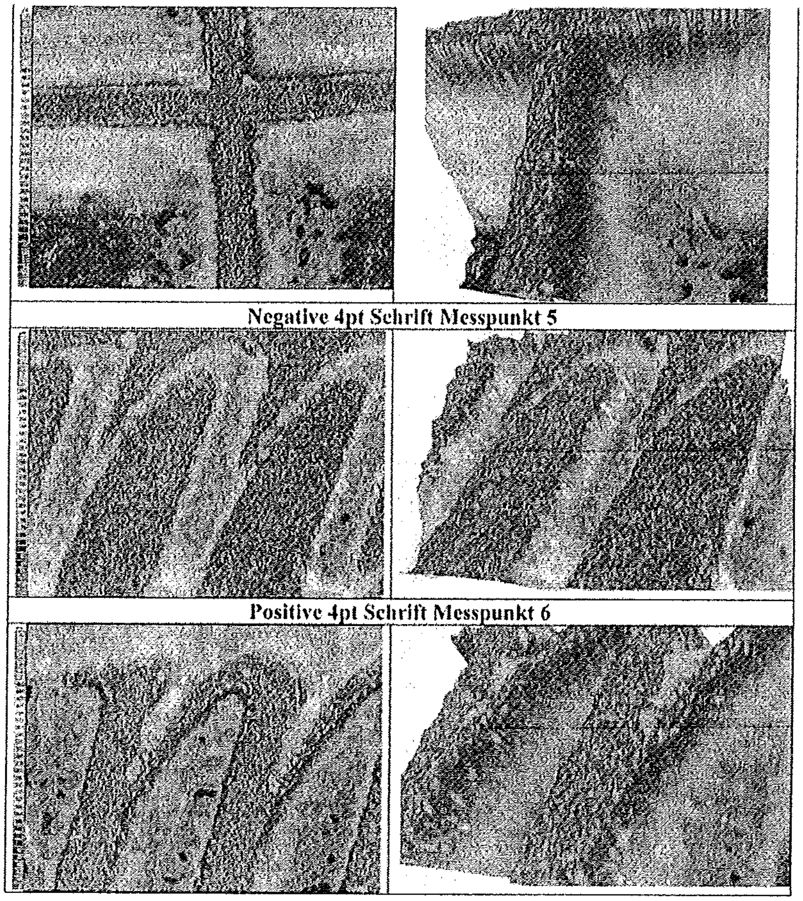
Figure 11C:
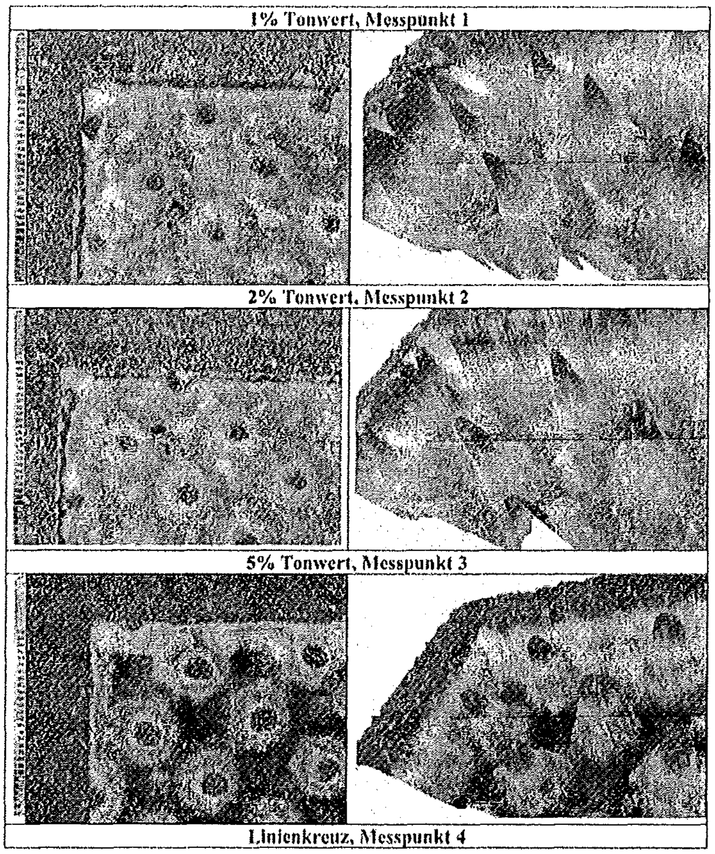
Figure 11D:
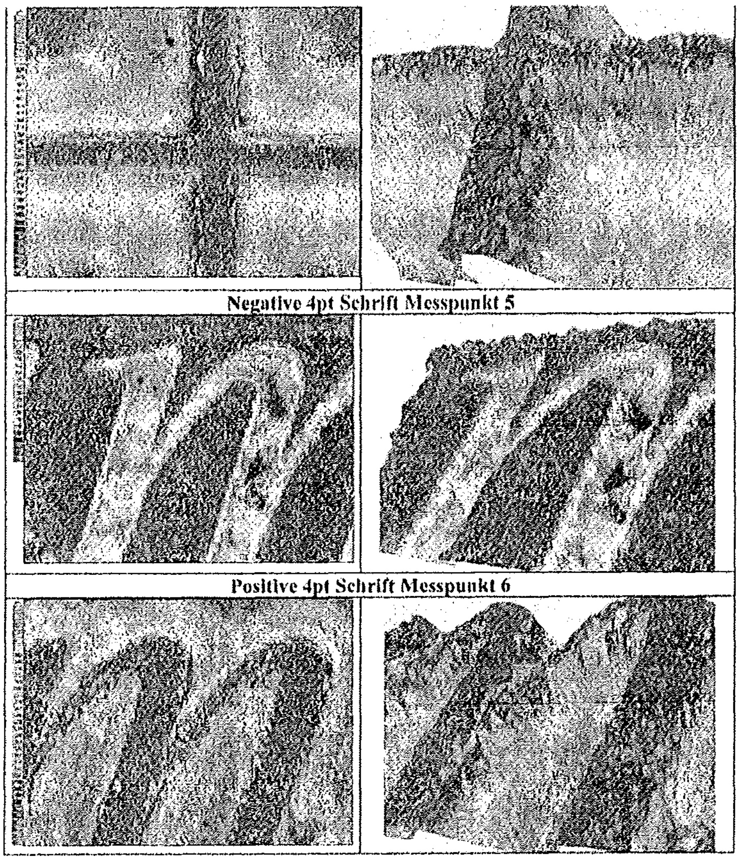
Figure 11E:
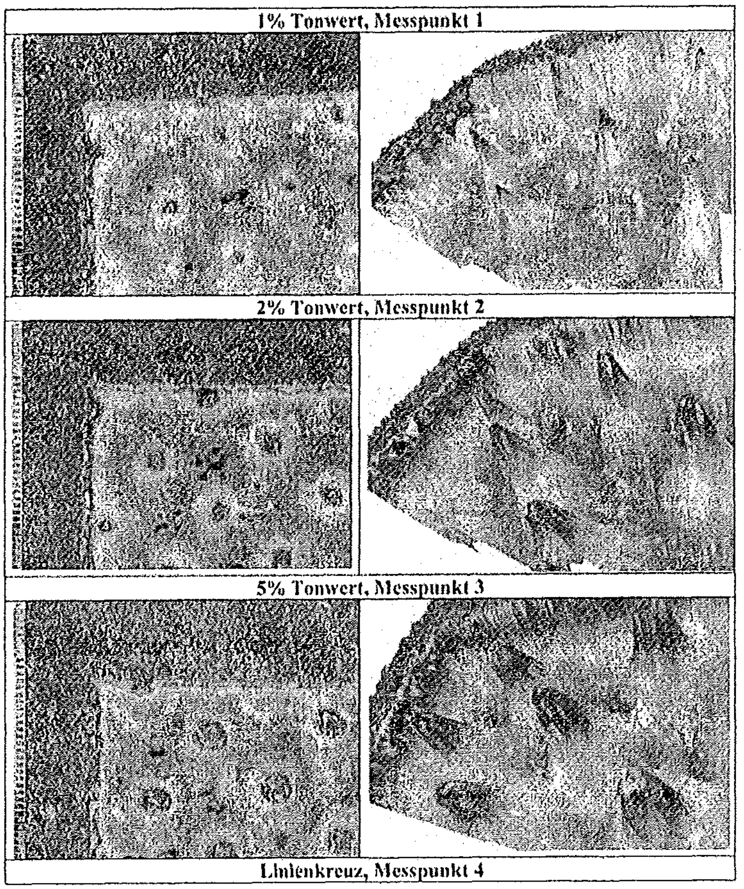
Figure 11F:
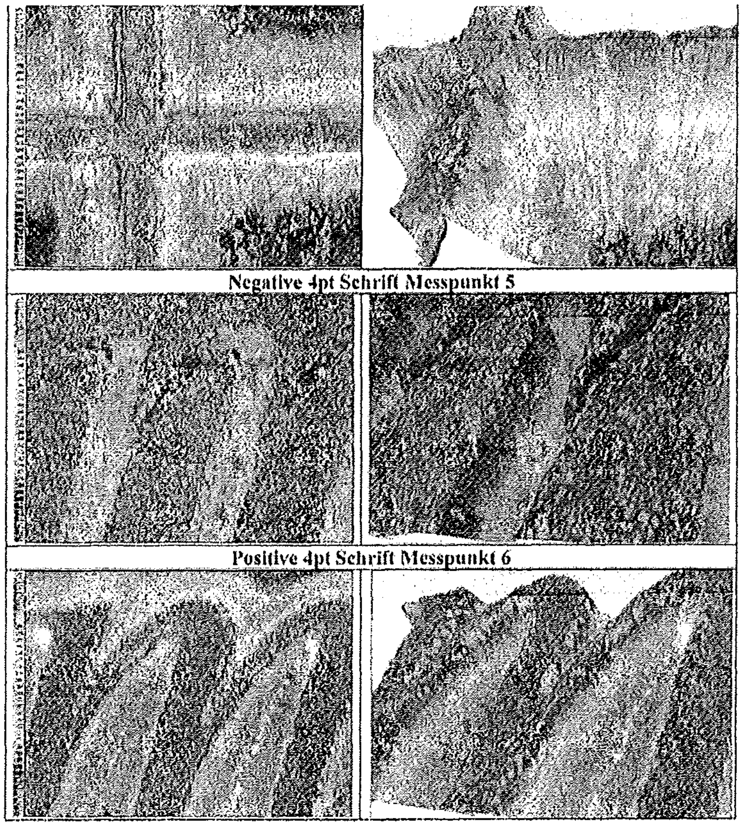

According to a preferred embodiment of the invention, laser engraving provides a true "direct-to-plate" technology for flexography. The method is applied and practiced without the need for complicated processing steps during manufacturing, resulting in a substantial gain in productivity from laser engraving. Also, the plates are relatively inexpensive to manufacture, obviating the need for a sophisticated mask coating as is needed for digitally imaged plates. Recently, there has been a decrease in flexo reliefs with the use of thin plates (–45 mil) becoming more common. This trend is very attractive and well-suited for the laser engraving of flexo plates.

However, for laser engraving plates in the market thus far, the image fidelity is not as good as current digitally imaged (laser ablation of a mask) or even conventional flexo plates. This relegates laser engraving to a niche market. Additionally, the productivity so far has not been good. Thus, there is a market need to improve both the two main deficiencies of engraving, compared with mask ablation-image quality and plate making productivity.

A laser engraving article according to a preferred embodiment of the invention comprises a flat engravable plate which is mounted on a round cylinder during the printing step, or a continuous "in the round" engravable sleeve. Either system comprises a carrier on which there may be one or more binder layers that are laser engravable.

The carrier for the laser engraving article depends on the end product. For the flat plates a heat stabilized polyethylene terephthalate (PET) of 5-7 mils thickness is preferred. The PET may be corona treated to improve adhesion, and may also be primer and adhesive coated.

For the sleeves the carrier may be a metal sleeve, typically nickel based or a composite sleeve. The sleeve is further primer and/or adhesive coated for improved adhesion. Often, the sleeve is further coated with a polyurethane foam which acts as the in situ cushion layer.

The choice of binder system for the engraving system is governed by a combination of its performance as a printing plate and sensitivity to or behavior in laser engraving. It is believed that a crosslinked millable polyurethane elastomer would provide the best performance attribute both for its printing performance and as an engravable system.

Millable Polyurethanes

Polyurethane elastomers for direct laser engraving applications can be divided in 3 broad classes:

1) Thermoplastic Polyurethanes (TPU)
2) Castable Polyurethanes (CPU) and,
3) Millable Polyurethanes (MPU)

All of the above have been tested in direct engraving applications but with very mixed results. Crosslinking of the elastomer is a requirement for the material to be used as an engravable elastomer. It was found that both the TPU and CPU resulted in a direct laser engraving (DLE) system that was unacceptable. The thermoplastic character in both resulted in undesirable melting artifacts and unacceptable imaging. Only the MPU showed acceptable engraving characteristics (clean engraving without melting artifacts).

Usually, TPU elastomers are typically produced in a single step with a slight excess of isocyanate (NCO). CPU elastomers are made by reacting polyol with a surplus of isocyanate in order to be in a liquid state during processing. Then, during final processing, the material is mixed with chain extenders to reach stoichiometric equivalence versus the combined OH number of polyol and chain extender. MPU elastomers on the other hand are produced with a final stoichiometric deficiency of isocyanates in order to obtain the necessary millable state.

MPU rubbers can be classified in accordance to either the chemical backbone or the type of vulcanization. As polyols, either polytetramethylene ether glycol ethers based on polytetrahydrofuran) or polyester adipates (based on adipic acid and diols like ethandiol, butanediol, methylpropanediol, hexanediol, neopentylglycol, cyclohexanedimethanol, etc.) can be used. The careful selection of diol/glycol and the molar ratio of glycol-blends influence the final properties of the MPU rubber. The right molar ratio of glycol blends is also important. The diisocyanate component is either aromatic diisocyanates like methylene diphenyl diisocyanate (MDI) and toluene diisocyanate (TDI) or aliphatic diisocyanate like dicyclohexylmethane diisocyanates or TMXDI (tetramethylxylene diisocyanate), which is a light stable isocyanate where the methylene groups separate the isocyanate groups from the aromatic ring. Aromatic diisocyanates provide excellent mechanical strength, whereas aliphatic diisocyanates give better heat and hydrolysis resistance. Aliphatic diisocyanates are also necessary if a light and color stable MPU is intended to be produced. Chain extenders are of low molecular weight like ethylene glycol, 1,4-butanediol, hydroquinone bis(2-hydroxy-ethyl)ether, glycerolmonoallylether, trimethylolpropane-monoallylether or water.

All polyurethane rubbers provide outstanding mechanical strengths and a high chemical resistance. Generally, ether-based polyurethane rubber provides excellent hydrolysis resistance, but poorer heat resistance, while ester based polyurethanes are typical for their outstanding oil and fuel resistance. Millable urethanes are polymers that are known for their excellent abrasion and strength properties, while being able to be processed on conventional rubber equipment. Existing millable urethanes are primarily used in applications that take advantage of these properties.

Polyurethane rubber is a specialty rubber that finds use in many common rubber articles such as skate wheels, conveyor belts, rubber covered rolls and other applications where urethane is used because of its properties. Urethane rubber compounds possess a unique combination of excellent abrasion resistance, excellent solvent and oil resistance, high tensile and tear properties, good resistance to ozone and oxygen, and good low temperature properties.

Peroxide Versus Sulfur Crosslinking of MPU

The vulcanization of polyurethane rubber leads to crosslinking between molecular chains, which result in a network structure. This resembles the concept of other vulcanized rubbers, but compared to other polyurethane elastomers, to a smaller number of urethane groups. These urethane groups form hydrogen bonds and contribute substantially to improved mechanical strength. For this reason, most polyurethane rubbers require the addition of active fillers like carbon blacks or silicas, which reinforce polyurethane rubbers in the same manner as with other rubbers. As will be seen later, the function of the reinforcing filler (carbon black) is also to increase the absorbance of the MPU to the lasing wavelength and additionally act as thermally dissipative additive.

Sulfur vulcanization requires unsaturated components to be built into the structure of polyurethane rubbers. This is done by using OH functional compounds with a double bond as chain extenders, for example glycerolmonoallylether (GAE) or trimethyipropane-monoallylether (TMPMAE). Of all isocyanates, only MDI hard segments are suitable coreactants for peroxide crosslinking. With MDI we get stabilized diphenylmethane radical formation through the central methylene group which then results in crosslinking of the MPU. MPUs based on other isocyanates, i.e., aliphatic isocyanates, require unsaturation for peroxide crosslinking. Unlike sulfur vulcanization, only small amounts of unsaturation are sufficient.

Peroxide crosslinking gives the best heat resistance and the lowest compression set. On the other hand, Sulfur vulcanization allows a wide processing flexibility. Overall, both peroxide and sulfur crosslinks can be used very effectively to crosslink solid urethane rubber compounds. Rubber compounding almost always involves some compromise, and decisions on what properties are most important are necessary to make educated decisions on ingredient types and amounts to use.

Millable Polyurethanes and Blends

Since MPUs are processed similar to rubber compounds, they could be blended together with rubber compounds such as Natural and NBR rubbers. This gives the advantage of having blends with synergistic properties. Blending MPU with rubber compounds also allows value added benefits such as superior swell resistance, cost reduction and other improvements in engraving speeds etc. A new class of TPEs called Energetic TPEs (ETPE) could also be blended to accelerate the burn rate during laser engraving.

Commercial Sources of Millable Polyurethanes and Blends

Millable Polyurethanes and their blends with Natural and NBR rubbers are commercially available from TSE Industries in USA (named Millathanes) and Rhein Chemie in Europe (named Urepan). Table 1 (FIG. 1) lists the various backbone structures available, either aliphatic, MDI or TDI or Polyester or Polyether based polyurethanes.

Advantages of MPU for Laser Engraving Applications for Flexo

MPUs allow the use of main chain backbones not available with TPUs, CPUs, and liquid photopolymers. This versatility allows the choice of backbone chemistries having desirable attributes for both laser engraving and for flexographic printing.

MPUs are commercially available and can be suitably optimized with additives to function as a direct laser engravable system. Commercially available manufacturing processes can be efficiently utilized.

MPUs allow versatility of crosslinking with both peroxides and sulfur. A crosslinked elastomer is a requirement for clean engraving of fine details.

High resolution engraving of small details is entirely possible using MPUs. Higher resolution and Screen Counts (5000 DPI, 200 LPI) are possible as compared to Rubber.

Further advantages achieved by using MPU in direct laser engraving include:

- Well known process for crosslinking or vulcanizing MPUs, similar to rubber
- Well known process for manufacture of plates and sleeves from MPUs
- MPUs allow formulatory versatility. Since MPUs are processed similar to rubber elastomers, MPUs allow mixing and blending of various additives typically required in Direct Laser Engraving with ease
- Outstanding Physical properties required for a Flexo printing plate, yet better ink transfer and better print quality than rubber elastomers
- MPUs allow blending of other co-binders such as rubber, ETPE etc. to give other benefits such as cost savings and improvement in engraving speeds etc.

Millable Polyurethanes (MPU) Compared to Cast Polyurethanes (CPU) and Thermoplastic Polyurethanes (TPU)

As seen from the above, MPU systems are ideal as a laser engravable elastomer and also as a flexographic printing plate. A comparison was made between MPU and CPU and TPU as a direct laser engravable flexographic system. CPU is made into a crosslinked thermoset during the manufacturing process. TPUs may be thermally crosslinked as well. Both CPU and TPU showed properties acceptable as a flexographic printing plate. However, both these systems did not perform adequately as an engraving elastomer. Both these elastomers showed severe melting artifacts from the engraving process, which resulted in undefined and blurred images resulting in unacceptable imprint quality. For the CPU the engraved residues were liquid in character and very tacky to touch, which is undesirable as well. The TPU also showed severe melting artifacts during the engraving process.

It was surmised that although the CPU are crosslinked and supposedly a thermoset in nature, there is still significant thermoplastic character or perhaps low crosslink density resulting in the heat from the laser undesirably melting rather than resulting in clean and sharp ablation or engraving. A like conclusion can be drawn for the crosslinked TPU. This is in contrast to MPUs, which did not show such melting artifacts, and showed a clean and sharp engraving profile.

Printing Plate/Sleeve

A preferred printing plate/sleeve has the approximate physical properties as provided in Table 2 (FIG. 2) below. These physical properties can serve as a guideline for a system behaving as a printing plate. Other attributes such as ink transfer are not reflected here. It is possible that systems having physical characteristics outside these parameters may also behave as a satisfactory printing plate. Many of these properties are interlinked. Thus, a high Shore A implies a high Modulus by nature. These physical characteristics can be easily measured on an Instron and may be a good starting point to consider when designing an elastomer for a laser engravable printing plate or sleeve. Another characteristic to consider is compatibility with inks. Thus, it is entirely possible to have more than one polymer system depending on its end use.

Laser Engraving

For the binder to be efficient in laser engraving, the main chain needs to have labile hetero bonds which have sensitivity at the respective lasing wavelengths of the lasers in the field such as carbon dioxide laser (10,600 NM) or a Yttrium-based fiber laser (1100 NM) or a neodymium-doped yttrium aluminum garnet (ND-YAG) laser (1060 NM) or a diode array laser (830 NM). For the lasers lasing in the near-IR regime such as Yttrium-based fiber, ND-YAG and Diode Array lasers, doping the binder elastomer with pigments such as carbon black is required to have absorption in that wavelength range. This interaction allows conversion of laser photons to heat efficiently and the elastomer is engraved when exposed to a laser beam of adequate intensity. The layer is preferably evaporated, or thermally or oxidatively decomposed in the process without melting, so that its decomposition products are removed from the layer in the form of hot gases, vapors, fumes or small debris particles. The gaseous products of decomposition are rapidly ejected from the surface at the speed of sound.

In general, thermoplastic elastomers (TPEs) based on Kraton polymers currently used in typical printing plates and other carbon based polymers such as polyolefins will not be efficient as engravable binders. Hydrophilic polymers mentioned above, such as polyurethanes, polyesterspolyamides, and polyvinylalcohol should function adequately as an engravable system. In particular, thermoplastic polyurethanes (TPUs) are suitable as laser engravable systems. However, the TPUs need to be crosslinked before they can adequately function both as a printing plate and as an engravable system. Use of polyurethanes based on Millable Polyurethanes allows both processing as TPUs and crosslinking similar to rubber.

Table 9 (FIG. 9) provides two formulations for crosslinking a typical MPU utilizing peroxide (Sample A) and sulfur (Sample B) as the crosslinking agent.

The final process for flexographic sleeves is as follows:

1. Formulation of MPUs with the curatives, co-agent, laser additives, and other additives was carried out in a compounder such as a Brabender. A 2-Roll mill may also be used in this step.
2. The compounded system is then extruded in a single screw extruder directly on the composite or Nickel sleeves, which has the adhesive or primer coating. A twin screw extruder may also be employed to do both the mixing and extrusion functions. The key obviously is to keep the extrudate temperature below the crosslinking temperature of the Peroxide or Sulfur crosslink system. Alternately, a "light crosslink" may also be possible at the tail end zones of the extruding cycle to allow forming the polymer and to minimize "cold flow" during the crosslink step.
3. The extruded sleeve is then wrapped with a nylon or Mylar webbing to minimize oxygen inhibition similar to "Roll crosslinking" operations used currently in rubber roll applications. A post-crosslink may also be necessary. Table 4 (FIG. 4) summarizes the process conditions used during the crosslink and post-crosslink steps. Obviously several sleeves could be crosslinked together for workflow reasons.
4. The surface of the sleeve is then ground or machined to bring the sleeve to the final gage. The MPU sleeve is now ready for laser engraving.
5. After the engraving step a simple water or detergent wash is all that is required to remove the residual debris.
6. The sleeve is now ready for the press.

The final process for flat flexographic plates is as follows:

1. Formulation of MPUs with the curatives, co-agent, laser additives, and other additives was carried out in a compounder such as a Brabender. A 2-Roll mill may also be used in this step.
2. The compounded system is then extruded in a single screw extruder directly between 2 polyester sheets. The top sheet acts as the protective coversheet. The bottom acts as the backing sheet preferably with an adhesive or primer. A twin-screw extruder may also be employed to do both the mixing and extrusion functions. The key obviously is to keep the extrudate temperature below the crosslinking temperature of the Peroxide or Sulfur crosslink system. Alternately, a "light crosslink" may also be possible at the tail end zones of the extruding cycle to allow forming the polymer and to minimize "cold flow" during the crosslink step. The extrusion takes place between nip rolls of a calendar, in order to control the thickness.
3. Alternately, and preferably, the compounded MPU system is hot pressed between the coversheet and backing polyesters to bring it to the precise gage required in the flexo process.
4. This sandwich structure is then crosslinked in a press typically used for rubber crosslinking making sure that the PET sheets are not warped during the crosslink step. A post-crosslink may also be necessary. Table 4 (FIG. 4) summarizes the process conditions used during the crosslink and post-crosslink steps. Obviously several plates could be crosslinked together for workflow reasons.
5. The crosslinked MPU plate is now ready for laser engraving after removing and discarding the top PET coversheet.
6. After the engraving step a simple water or detergent wash is all that is required to remove the residual debris.
7. The plate is now ready for the press.

For test purposes the compounds listed in Table 3 (FIG. 3) were also hot-pressed and crosslinked in a typical commercially available rubber crosslinking press at elevated temperatures and pressures (160° C., 60 PSI). The plaques were mounted on the mandrel of the Yttrium based fiber laser. Table 5 (FIG. 5) summarizes the laser conditions used during the engraving tests and also the results of the engraving test carried out on the sample set from Table 3 (FIG. 3). Only a detergent and water wash rinse steps were required to clean the debris.

Additives

Most of the MPUs need to be further modified or compounded to be functional as a laser engraving system. The choice of additives will be dependent on the proposed effect. Additives can be classified under the following categories.

Additives to Increase Laser Sensitivity

Additives to increase laser sensitivity increase the absorptivity of the polymer at the lasing wavelengths. There are two areas that can be used as a resource for laser additives: Laser Marking and Solar Absorbing Glass used in automotive and greenhouse applications. Both of these use a strong IR absorber additive, which acts to convert IR photons to heat. Since many of these additives are nanomaterials, uniformly and molecularly dispersing these in the binder of choice presents a challenge. Laser masterbatches are available for ease of incorporation in the binder system. There are additives that are selective for both lasers lasing in the far IR range (e.g. $CO_2$ 10,600 NM) and those lasing in the near IR range for (830-1100 NM). These additives are available from a number of sources depending on the IR regime, such as Engelhard, Sumitomo Metal Mining and Clariant, among others.

The mica additives are well known for this function. The most common additive used in laser engraving applications is carbon black pigment, which also acts as a reinforcing filler.

Additives for Heat Dissipation

The incorporation of certain additives for charge dissipation in coating systems, films or composites can reduce the buildup of static charge. Typically these are used in the electronics industry to avoid destructive discharges that can harm electronic components or, in hazardous operations, where it may act as an ignition source. In addition, these conductive additives have also been used in films used to produce conductive display screens, such as for interactive touch screens, eliminating the need to use expensive sputtering technologies. Some of these additives can also be incorporated in our engraving polymer systems to dissipate the heat buildup in the MPU elastomers, which are known poor conductors of heat. Use of heat dissipative or heat conductive additive would allow engraving at very high resolutions, up to 5080 DPI and allow Screen rulings of up to 200 LPI (80 LPC). At such high resolutions there is tremendous heat buildup from the laser. In addition the dots and lines at such high resolutions are of very small dimension (<10 pm). These fine structures will have a propensity to degrade or melt if the heat generated is not removed efficiently. Use of heat dissipative additives allows engraving of such fine structures.

The most promising additives for heat dissipation during engraving are available from companies such as Nanophase Technologies. Nanoparticles based on metals, such as silver and copper, can be used as heat dissipaters. Nanoparticles based on metal oxides such as Indium-Tin-Oxide and copper oxide, have shown high propensity of heat dissipation when used in small amounts. Nano copper oxide is the most cost effective in this application.

Other additives that may be used are Carbotherm Boron Nitride platelets available from Saint-Gobain Advanced Ceramics. There are some grades of carbon black pigment and graphite platelets which function as both the laser wavelength absorptive and as heat dissipative or conductive additives.

Additives for Density Reduction of the Elastomeric Composition

Since laser engraving is a mass transfer phenomenon, it is believed that if the bulk density of the polymer were reduced without affecting the integrity of other physical attributes, it would aid in increasing the productivity in laser engraving of the printing plate—a current shortcoming in laser engraving systems. The extreme case is, of course, the difference in engraving sensitivity and power requirements of steel versus a rubber, all else being equal.

Additives that can be advantageously used in density reduction are Microspheres from Akzo Nobel, Borosilicate glass bubbles from 3M and spherical porous silica. Microspheres decrease the density of the polymer and increase the rate of mass transfer during laser engraving. There are various microspheres, but the most promising are the unexpanded microspheres and crosslinked nanospheres. The former has liquid hydrocarbon encapsulated in a thermoplastic polymer shell, which expands during the extrusion process causing a drop in bulk density from–1.0 to–0.2. FIG. 10 indicates theoretically the concept of balancing the physical properties and laser sensitivity (productivity) which run counter to each other: Borosilicate Glass bubbles have adequate "crush strength" to survive the various extrusion and mixing processes.

Burn-Rate Modifiers

Additives from the fields of propellants and rocketry dealing in burn-rate modification can be used to decrease the pyrolysis temperature of the MPU elastomers during laser engraving, giving work flow advantage by increasing the engraving speed. Since laser engraving is a "mass transfer" process, the efficiency of engraving can be improved by the use of suitable oxidizers and burn-rate modifier described below.

These additives need to be stable at the process conditions used for crosslinking or vulcanization of the elastomers (160C and 60+ PSI). Common oxidizers are Ammonium Perchlorate, Ammonium Nitrate and Potassium Nitrate. Common burn rate catalysts, which can be employed, are various oxides of metals such as Iron Oxides, Copper oxides, Copper Chromates, Chrome Oxides, manganese oxides etc. and organic derivatives such as Ferrocene. Typical fuels or burn rate accelerators used could be aluminum, boron and magnesium powders especially as nanoparticles from the field of nanotechnology. A combination of the above additives can be used to accelerate the burn rate of our elastomer composition during laser engraving.

Recent emerging field of "nanoenergetics" can also be used advantageously. Nanoenergetic materials can store higher amounts of energy than conventional energetic materials and one can use them in unprecedented ways to tailor the release of this energy so as to increase the burn rate of our elastomers resulting in higher productivity during the engraving process.

Energetic Thermoplastic Elastomers (ETRE) are another class of polymer compounds that can be blended in with the MPUs. ETPEs are thermoplastic elastomers with an energetic content in their backbone that is released during the engraving process resulting in lowering the pyrolysis temperature of the overall formulation and accelerating the burn rate. Examples of ETPE are polymers based on oxetane groups (PolyN IMMO-Poly(3-nitratomethyl-3-Ethyl Oxetane) and Azide groups (GAP- Glycidyl Azide Polymer). ETPEs are available allowing process temperatures below the vulcanization temperature of the MPUs (160C).

Lasing Wavelength

Much of the efforts in the industry have been focused on CO2 lasers because such lasers are mature technology. CO2 lasers typically have a spot size of around 40 pm. Thus, it is difficult to achieve image fidelity higher than 100-125 LPI. The advantage is that the lasing wavelength (10,600 NM) allows a wide use of elastomers due to their absorptivity. Near IR lasers, particularly Yttrium-based fiber (1100 NM) and ND-YAG lasers (1060 NM), have a significantly lower spot size (–10 pm) allowing resolutions of 125-200 LPI. The problem is that the lasing wavelength (1060 NM) makes the choice of a binder difficult since most binders do not absorb at that wavelength. Additionally, historically, these Near-IR lasers do not have adequate power for engraving so productivity was not good. These shortcomings can be overcome by a judicious choice of binder and additive (carbon black pigment). Recently, however, the Yttrium-based fiber laser and the ND-YAG lasers have shown advances where the power required for elastomer engraving is adequate. Diode array lasers in the near IR (830 NM) are also available and increasing in power capacity.

Crosslinking of TPUs and TPEs may be inefficient, resulting in unsatisfactory engravability (see Comparative Example 4 below). The crosslink density of TPUs considered was not high enough to allow sufficient engraving. Engraving wavelength is a key consideration in the preparation of a good engraving plate. Near IR wavelengths (830-1110 NM) are preferred over the far IR (10,600 NM) for high-resolution engraving. Additives such as Carbon Black may be needed to make it absorptive. This disallows the use of UV crosslinking (UV curable TPUs, TPEs and liquid photopolymers). Liquid photopolymers that are also polyurethanes are discussed in U.S. Pat. No. 7,029,825 to Asahi.

There are two key properties that essentially characterize laser light, namely lasing wavelength and beam quality. Typical lasers used in Graphic Arts imaging work in the infrared range: GaAs: 864 nm, Nd-YAG: 1060 nm, Yttrium fiber laser: 1110 nm, CO2: 10600 nm. In addition to wavelength, the beam quality is also a key characteristic of the particular laser type. The ideal laser beam has a radially symmetric Gaussian intensity distribution. The beam quality is defined in the form of e.g. beam quality coefficient M2. The ideal laser has an M2 of 1. It is close to 1 for fiber lasers, approximately 5 for YAG lasers and approximately 15 for diode lasers. Both the wavelength and the beam quality have a direct influence on the image quality. They define the resolution and depth of focus of the write beam. The resolution is determined by the spot size of the laser beam (beam diameter in focus). The smaller the beam when focused on the printing plate, the higher the resolutions achieved. Typically, with all else equal, the spot size is a function of wavelength and depth of focus.

The productivity of a laser is particularly important when it comes to direct engraving. The imaging and engraving times depend essentially on two factors:

1. The laser power available on the material. The only aspect determining the productivity of a laser is the power actually applied to the surface of the engraving article.
2. The sensitivity of the material being processed. This is specified in $J/cm^2$ or $Ws/cm^2$. Direct engraving uses a variable depth approach. It is therefore logical to define the sensitivity of the material as the energy per quantity of material.

In conclusion, the CO2 laser is a very mature technology but has only limited usage for high resolution flexo direct laser engraving applications. The Yttrium fiber laser and the ND-YAG lasers are increasing in their power capacity and applicability for engraving at resolutions in excess of 4000 DPI and at Screen counts approaching 200 LPL Preferred embodiments of the invention are further explained and exemplified below.

EXAMPLE 1

Laser Direct Engraving of Millable Polyurethanes using a Near IR (Yttrium-based Fiber) Lasing at 1100 NM A number of MPU and MPU/Nitrile Butadiene Rubber Blends summarized in Table 1 (FIG. 1) were included in this engraving test. Table 3 (FIG. 3) summarizes the sample set that was tested as a direct laser engravable system in the Yttrium based fiber laser. As can be seen from Table 3 (FIG. 3) the test matrix included 3 different types of hard segments (Aliphatic Isocyanate, MDI and TDI) and 2 different types of soft segments (Polyester and Polyether) from the options available in the Millable PU range. In addition there were 2 different types of thermal curatives: Peroxide crosslinking and Sulfur vulcanization. Some curatives were specific to the type of PU. There are significant advantages and disadvantages of each curative.

Table 4 (FIG. 4) summarizes the crosslinking conditions and the physical properties of each formulated system used for the engraving test from Table 3 (FIG. 3). It is seen that most samples show excellent physical properties within the range described in Table 2 (FIG. 2) from above. Thus, most of the formulated MPUs will function as an excellent flexographic printing system.

Formulation of MPUs with the curatives, co-agent, laser additives, and other additives was carried out in a compounder such as a Brabender. A 2-Roll mill may also be used in this step. The compounded system is then extruded in a single screw extruder directly on the composite or Nickel sleeves, which has the adhesive or primer coating. A twin screw extruder may also be employed to do both the mixing and extrusion functions. It is important to keep the extrudate temperature below the crosslinking temperature of the Peroxide or Sulfur crosslink system. Alternately, a “light crosslink” may also be possible at the tail end zones of the extruding cycle to allow forming the polymer and to minimize “cold flow” during the crosslink step. The extruded sleeve is then wrapped with a nylon or Mylar webbing to minimize oxygen inhibition similar to “Roll crosslinking” operations used currently in rubber roll applications. A post-crosslink may also be necessary. Table 4 (FIG. 4) summarizes the process conditions used during the crosslink and post-crosslink steps. Obviously several sleeves could be crosslinked together for workflow reasons. The surface of the sleeve is then ground or machined to bring the sleeve to the final gage. The MPU sleeve is now ready for laser engraving. After the engraving step a simple water or detergent wash is all that is required to remove the residual debris. The sleeve is now ready for the press. In the case of flat plates a similar process as above is employed except the compounded MPU system is hot pressed between a coversheet and backing polyesters. The precise thickness or plate gage is thus achieved during the hot-press process.

For test purposes the compounds listed in Table 3 (FIG. 3) were hot-pressed and crosslinked in a typical commercially available rubber crosslinking press at elevated temperatures and pressures (160° C., 60 PSI). The plaques were mounted on the mandrel of the Yttrium based fiber laser. Table 5 (FIG. 5) summarizes the laser conditions used during the engraving tests and also the results of the engraving test carried out on the sample set from Table 3 (FIG. 3). Only a detergent and water wash rinse steps were required to clean the debris.

As mentioned before, since the MPU has very little absorbance at the lasing wavelength of the Fiber laser, all of the samples were doped with an absorbing CB pigment. The entire sample set showed adequate sensitivity to the Yttrium fiber laser, as seen in Table 5 (FIG. 5). FIGS. 11A-11F shows digital photographs of the laser imaging studies from Table 5 (FIG. 5) on the Yttrium-based fiber laser. As can be seen from pictures, the resolution of fine images achieved in this test was excellent, with imaging of very fine and sharp dots and deep reverses being achieved.

As can also be seen from Table 5 (FIG. 5), most samples had relief depth of around 450 tams. There was very little undercut seen indicating that artifacts such as melting of fine dots are not an issue with MPUs. Although the resolution employed for this test was 2540 DPI and screen ruling of 125 LPI, it may be possible to use up to 5080 DPI and allow screen rulings up to 200 LPI, which is only achievable in Digital flexo plates.

Several other factors were considered such as level of coagent, level of plasticizer, type and level of other laser additives discussed before etc.

Several conclusions were noted from these tests:

Ester vs. Ether Soft Segments: Between Ester and Ether soft segments, the esters seem to give sharper image. However, this was not conclusive.

TDI-ester vs. MDI-Ester Hard Segments: From this preliminary study TDI/Ester seems to give better results than MDI/Ester.

EXAMPLE 2

Laser Direct Engraving of Millable Polyurethanes using a Far IR (CO2) Laser Lasing at 10,600 NM Similar to Example 1 above, MPU and MPU/Nitrile Butadiene Rubber Blends summarized in Table 1 (FIG. 1) were included in this engraving test. Table 6 (FIG. 6) summarizes the various samples that were tested as a direct laser engravable system. Various commercially available MPU and MPU/Rubber blends were used. In addition, two different types of thermal curatives were used: Peroxide and Sulfur (vulcanization). Unlike the sample set for the Yttrium laser, several samples were included without the use of a Carbon Black pigment dopant. These clear samples imaged as well as their doped counterparts. This is the major advantage of the CO2 lasers lasing in the far IR regime-elastomers without absorbing additive can be used for laser engraving.

The process conditions used, method of compounding, crosslinking and laser engraving was similar to what is described in Example 1. The physical properties of the sample set were also similar to what was described in Table 4 (FIG. 4) from the above Example 1. As before, it was seen that most samples show excellent physical properties and would thus function as an excellent flexographic printing system. This was true even for the MPU/Rubber blends. This is one of the major advantages of MPU-the versatility and flexibility to allow blends of other elastomers, TPEs etc. for value added.

Once again other factors tested were the type and level of coagents used. Sample sets with higher loading of TMPTMA and lower loadings were briefly studied. Higher coagent level, not surprisingly gave faster crosslinking and higher crosslink density and sharper image fidelity after the engraving step.

As seen from Table 6 (FIG. 6), most all of the crosslinked Millable PU plaques showed clean and sharp engraving, even the samples without the Carbon Black additive. Only a detergent and water wash rinse steps were required to clean the debris.

Additionally, the entire sample regime in Table 6 (FIG. 6) showed adequate sensitivity to the CO2 laser as seen from the "depth" of the trough engraved (18-20 mils at 100% Power and 6-8 mils at 50% Power). The initial engraving test was positive enough for us to attempt some rudimentary imaging. The image fidelity, for the most part, was acceptable, but not as good as those from the Yttrium fiber laser.

COMPARATIVE EXAMPLE 3

Laser Direct Engraving of Castable Polyurethanes using a Far IR (CO2) Laser Lasing at 10,600 NM Cast Polyurethanes were made using typical commercially available processes. The raw materials were available from Anderson Development Company. The physical properties and test results from the engraving tests are summarized in Table 7 (FIG. 7). The physical properties were acceptable as a Flexo plate. However, the elastomers showed severe melting artifacts that resulted in undefined and blurred images and unacceptable imprint quality. The engraved residues were undesirably liquid in character and very tacky to touch. It appears that although the Cast Polyurethanes are crosslinked, there is still significant thermoplastic character or low crosslink density resulting in the heat from the laser undesirably melting rather than resulting in clean and sharp ablation or engraving. This is in contrast to MPUs, which did not show such melting artifacts.

COMPARATIVE EXAMPLE 4

Laser Direct Engraving of Thermoplastic Polyurethanes using a Far IR (CO2) Laser Lasing at 10,600 NM Table 8 (FIG. 8) teaches the use of a crosslinked TPU for laser engraving. The crosslinking was carried out during the extrusion step. The TPU was compounded with the additives and extruded in a TSE (or single screw) keeping manufacturer recommended extrusion temperatures (see Samples 8A-8J). The article was then laser engraved on a $CO_2$ laser lasing at 10,600 NM commonly available in the market. Just like for the, CPU in Comparative Example 3 above, the crosslinked TPU showed severe melting artifacts, with undefined and blurred images resulting in unacceptable imprint quality. It was surmised that although the TPUs are crosslinked, there is still significant thermoplastic character or low crosslink density resulting in the heat from the laser melting rather than creating clean and sharp ablation or engraving. This is in contrast to MPUs, which did not show such melting artifacts.

Figure 12:
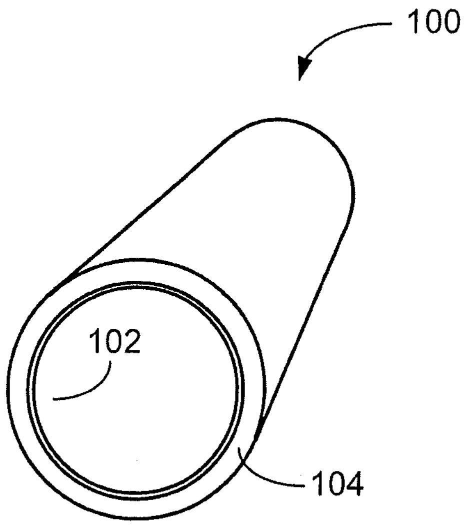
FIG. 12 is a perspective view of an engraving article.

FIG. 12 is a perspective view of an engraving article 100 having an inner composite or nickel sleeve 102 having a thickness of approximately 7 to 10 mils, and an outer MPU engraving rubber surface 104 having a thickness of approximately 67 to 125 mils.

While specific embodiments of the present invention have been described, it will be apparent to those skilled in the art that various modifications thereto can be made without departing from the spirit and scope of the invention. Accordingly, the foregoing description of the preferred embodiment of the invention and the best mode for practicing the invention are provided for the purpose of illustration only and not for the purpose of limitation.

What is claimed is:

1. A method of making a flexographic printing article comprising:

(a) applying millable polyurethane to a substrate, the millable polyurethane capable of being cross-linked or vulcanized and having an absorptive of laser radiation having a wavelength between approximately 830 nanometers and approximately 10,600 nanometers, wherein an outer layer of the millable polyurethane comprises an additive for increasing laser absorptivity of the layer, and wherein the additive is selected from the group consisting of nanomaterials, mica, carbon black, kaolin clay, antimony tin oxide, and copper oxide;

(b) thermally crosslinking the millable polyurethane to provide a laser-engravable element; and (c) forming a relief in the element by at least laser engraving the crosslinked millable polyurethane, wherein no intermediate processing steps occur between steps (b) and (c).

2. A method according to claim 1, wherein crosslinking the millable polyurethane includes the step of crosslinking by a process selected from the group consisting of a peroxide-based process and a vulcanization process using sulfur.

3. A method according to claim 1, further comprising adding a binder selected from the group consisting of a polyester-based polyurethane processed as a millable polyurethane, and a polyether-based polyurethane processed as a millable polyurethane during step (a).

4. A method according to claim 1, wherein step (c) comprises engraving the element using laser radiation having a wavelength between approximately 830 nanometers and approximately 1100 nanometers.

5. A method according to claim 1, wherein the millable polyurethane is extruded into an article selected from the group consisting of a flat printing plate and a continuous in-the-round printing sleeve.

6. A method according to claim 1, further comprising adding during step (a) an additive for increasing heat dissipation in the element, wherein the additive is selected from the group consisting of metal-based nanoparticles, metal-oxide based nanoparticles, carbotherm boron nitride platelets, carbon black, and graphite.

7. A method according to claim 1, further comprising adding during step (a) an additive for reducing the density of the element, wherein the additive for reducing the density of the element is selected from the group consisting of borosilicate glass bubbles and spherical porous silica.

8. A method according to claim 1, further comprising adding during step (a) a burn-rate modifier for decreasing the pyrolysis temperature of the element, wherein the burn-rate modifier for decreasing the pyrolysis temperature of the element is selected from the group consisting of ammonium perchlorate, ammonium nitrate, potassium nitrate, iron oxide, copper oxide, copper chromate, chrome oxide, manganese oxide, ferrocene, aluminum, boron, magnesium powder, oxetane group energetic thermoplastic elastomers, and azide group energetic thermoplastic elastomers.

* * * * *